US010236768B2

(12) United States Patent
Koe

(10) Patent No.: US 10,236,768 B2
(45) Date of Patent: Mar. 19, 2019

(54) SWITCHED-CAPACITOR CHARGE PUMP WITH REDUCED DIODE THRESHOLD VOLTAGE AND ON STATE RESISTANCE

(71) Applicant: GLOBALFOUNDRIES INC., Grand Cayman (KY)

(72) Inventor: Wern Ming Koe, Irving, TX (US)

(73) Assignee: GLOBALFOUNDARIES INC., Grand Cayman (KY)

( * ) Notice: Subject to any disclaimer, the term of this patent is extended or adjusted under 35 U.S.C. 154(b) by 53 days.

(21) Appl. No.: 15/599,596

(22) Filed: May 19, 2017

(65) Prior Publication Data

US 2018/0337596 A1 Nov. 22, 2018

(51) Int. Cl.
| | | |
|---|---|---|
| *G05F 1/10* | (2006.01) | |
| *G05F 3/02* | (2006.01) | |
| *H02M 3/07* | (2006.01) | |
| *H03K 5/1532* | (2006.01) | |

(52) U.S. Cl.
CPC .......... *H02M 3/073* (2013.01); *H03K 5/1532* (2013.01)

(58) Field of Classification Search
CPC .. H02M 3/073; H02M 3/07; H02M 2003/077; G11C 5/145; G05F 3/205
USPC ........................................................ 327/536
See application file for complete search history.

(56) References Cited

U.S. PATENT DOCUMENTS

| | | | | |
|---|---|---|---|---|
| 6,747,897 | B2 * | 6/2004 | Karaki ................... | G11C 5/145 257/E27.081 |
| 2010/0308899 | A1 * | 12/2010 | Wong .................... | H02M 3/073 327/536 |
| 2011/0241767 | A1 * | 10/2011 | Curatola ................. | H02M 3/07 327/536 |
| 2015/0054571 | A1 * | 2/2015 | Watanabe ............... | H02M 3/07 327/536 |
| 2015/0263610 | A1 * | 9/2015 | Ferrant ................. | H02M 3/073 327/536 |
| 2016/0343428 | A1 | 11/2016 | Chan et al. | |

FOREIGN PATENT DOCUMENTS

| | | |
|---|---|---|
| EP | 3076548 | 10/2016 |
| TW | 201347378 | 11/2013 |
| TW | 201521341 | 6/2015 |
| WO | 0250911 | 6/2002 |
| WO | 2017062144 | 4/2017 |

OTHER PUBLICATIONS

John F. Dickson, "On-Chip High-Voltage Generation in MNOS Integrated Circuits Using an Improved Multiplier Technique", IEEE Journal of Solid-State Circuits, Jun. 1976, 5 pages.
Office Action dated Sep. 20, 2018 in related TW Application No. 106123657, 10 pages.

* cited by examiner

*Primary Examiner* — Anh Q Tra
(74) *Attorney, Agent, or Firm* — David Cain; Andrew M. Calderon; Roberts Mlotkowski Safran Cole & Calderon, P.C.

(57) ABSTRACT

The present disclosure relates to a structure which includes a diode-based Dickson charge pump which is configured to use an independent multi-gate device to reduce a threshold voltage of a plurality of transistor diodes during a charging and pumping phase.

19 Claims, 7 Drawing Sheets

| Iload (A) | bgsw (V) | *nobg (V) |
|---|---|---|
| 0 | 7.77 | 5.17 |
| 1.00E-05 | 7.48 | 4.72 |
| 2.00E-05 | 7.35 | 4.61 |
| 5.00E-05 | 7.11 | 4.44 |
| 1.00E-04 | 6.85 | 4.25 |
| 2.00E-04 | 6.40 | 3.93 |
| 3.00E-04 | 6.00 | 3.65 |
| 4.00E-04 | 5.62 | 3.37 |
| 5.00E-04 | 5.24 | 3.11 |
| 7.50E-04 | 4.33 | 2.46 |
| 1.00E-03 | 3.42 | 1.83 |

SWITCHED-CAPACITOR CHARGE PUMP WITH REDUCED DIODE THRESHOLD VOLTAGE AND ON STATE RESISTANCE

FIELD OF THE INVENTION

The present disclosure relates to a switched-capacitor charge pump, and more particularly, to a switched-capacitor charge pump with reduced diode threshold voltage and on state resistance using self-generated switching back-gate bias voltage.

BACKGROUND

In a typical bulk CMOS process, the bulk of a transistor diode is grounded. Therefore, the threshold voltage of the transistor diode in a typical bulk CMOS process is high due to the back-gate effect. As a result, the threshold voltage of each transistor diode stage increases as the source to bulk voltage, the voltage across source to bulk (i.e., VSB), of the transistor diode for each stage increases.

Moreover, in the typical bulk CMOS process, as the threshold voltage of each transistor diode stage increases, a lower maximum output voltage and lower voltage conversion efficiency results.

SUMMARY

In an aspect of the disclosure, a structure includes a diode-based Dickson charge pump which is configured to use an independent multi-gate device to reduce a threshold voltage of a plurality of transistor diodes during a charging and pumping phase.

In another aspect of the disclosure, a structure includes a diode-based Dickson charge pump which is configured to use a fully-depleted silicon on insulator (FDSOI) structure to reduce a threshold voltage of a plurality of transistor diodes during a charging and pumping phase.

In another aspect of the disclosure, a method includes reducing a threshold voltage of a plurality of transistor diodes in a charge pump from a predetermined voltage level during a charging and pumping phase, and returning the threshold voltage of the plurality of transistor diodes to the predetermined voltage level in the charge pump during a holding phase.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
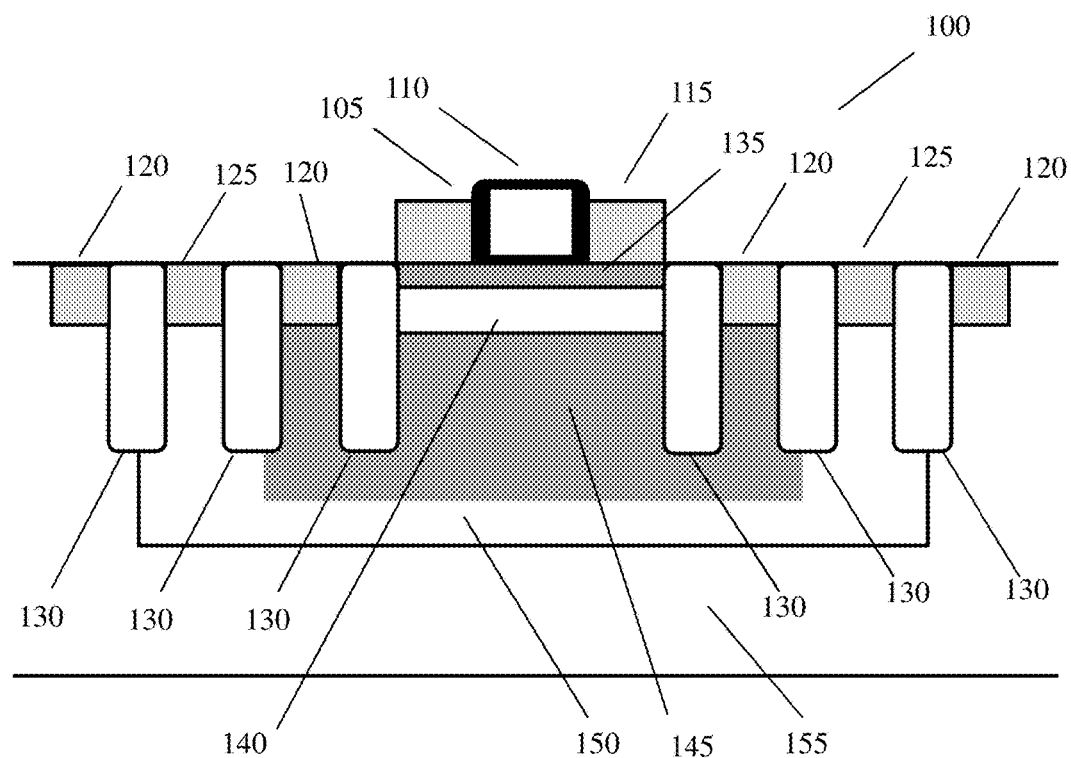
FIG. 1A shows a fully depleted silicon on insulator (FDSOI) device in accordance with aspects of the present disclosure.

The present disclosure relates to a switched-capacitor charge pump, and more particularly, to a switched-capacitor charge pump with reduced diode threshold voltage and on state resistance using self-generated switching back-gate bias voltage. In more specific embodiments, a charge-pump voltage generator takes advantage of a fully depleted silicon on insulator (SOI) structure (or any independent multi-gate structure technology) to reduce the threshold voltage of a transistor diode during an on state and to increase the threshold voltage of the transistor diode during the off state. Advantageously, by implementing the charge-pump voltage generator performance is boosted and power is saved.

In embodiments, in a fully depleted silicon on insulator (FDSOI) technology as described herein, manipulation of the voltage threshold can occur through dynamic biasing of the back-gate. Further, in FDSOI, the source and drain are isolated from the well by a thin insulating layer. Therefore, in comparison to a conventional bulk CMOS device, a source-to-well and drain-to-well junction as described herein is not present within the well due to the insulating layer. Further, in comparison to a conventional bulk CMOS device, a range of forward biasing is not limited by latch-up. For example, in a conventional bulk device, the bulk (or even the isolated well) cannot connect to any voltages higher than the drain or source to avoid forward biasing the drain/source-to-well junction diode. That is, in a bulk CMOS device, the bulk COMS device is bias dependent. However, as described herein, the source/drain capacitor to well is bias independent.

In embodiments, the charge pump is a diode-based Dickson charge pump which comprises cascaded Villard doublers followed by a peak detector. The Villard doublers are used to provide a voltage shift to an input voltage in cascaded stages. The peak detector provides smoothing of the output of the final stage of the Villard doublers. Also, in embodiments, a back-gate of a transistor diode of a first stage of the charge pump is biased with a switching clock voltage with a back-gate of subsequent transistor diodes in subsequent stages being biased with a same switching voltage generated for a front-gate voltage. To generate back-gate bias beyond the supply and ground voltage, the charge-pump voltage generator is highly efficient to boost performance and save power. In contrast, in known memory systems, lower voltage conversion efficiency and lower maximum output voltage results because the threshold voltage of each transistor diode stage increases.

In embodiments, the charge pump is configured to use an independent multi-gate device to reduce a threshold voltage of a plurality of transistor diodes during a charging and pumping phase. Further, the independent multi-gate device can be used to return the threshold voltage of the plurality of transistor diodes to a higher voltage during a holding phase.

The independent multi-gate device can include a fully depleted silicon on insulator (FDSOI) structure. A plurality of capacitors can be connected between each stage of the charge pump. Further, the threshold voltage of the plurality of transistor diodes can be returned to the predetermined voltage level in the charge pump during a holding phase.

FIG. 1A shows a fully depleted silicon on insulator (FDSOI) NFET with flipped-well structure in accordance with aspects of the present disclosure. The FDSOI NFET with flipped-well device 100 includes a source 105, a gate 110, a drain 115, a doped P+ region 120, a doped N+ region 125, a shallow trench isolation (STI) region 130, a channel 135, a buried oxide (BOX) layer 140, a p-well 145, a doped n-well 150, and a p-substrate 155 (i.e., ground). In FIG. 1A, the source 105 and the drain 115 are isolated from the p-well 145 by a thin insulator layer (i.e., buried oxide layer 140). In this way, a source-to-well and drain-to-well junction is not present in the p-well 145 due to the buried oxide layer 140. Therefore, in the FDSOI device 100, a range of forward biasing is not limited by latch-up and a source-to-well and drain-to-well capacitor to the p-well 145 is bias independent. Also, in the FDSOI 100, a voltage threshold manipulating can occur by dynamic biasing of the back-gate. Although FIG. 1A shows a FDSOI NFET with a flipped well structure, embodiments are not limited. For example, in another embodiment, the present disclosure can be configured using a FDSOI PFET with a flipped well structure.

Figure 1B:
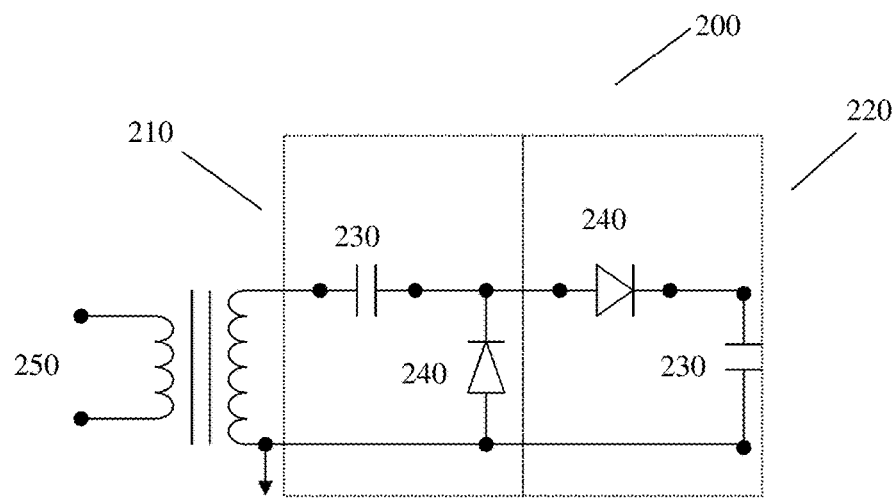
FIG. 1B shows a diode-based Dickson charge pump in accordance with aspects of the present disclosure.

FIG. 1B shows a diode-based Dickson charge pump in accordance with aspects of the present disclosure. In embodiments, the diode-based Dickson charge pump 200 includes a Villard doubler 210, a peak detector 220, and a transformer 250. In embodiments, the Villard doubler 210 uses a capacitor 230 and a diode 240 to provide a voltage shift to an input voltage in cascaded stages. The peak detector 220 also uses the capacitor 230 and the diode 240 to provide smoothing of the output of the final stage of the Villard doubler 210. The transformer 250 is configured to step up (i.e., increase) and step down (i.e., decrease) AC voltages which are input to the Villard doubler 210.

Figure 2A:
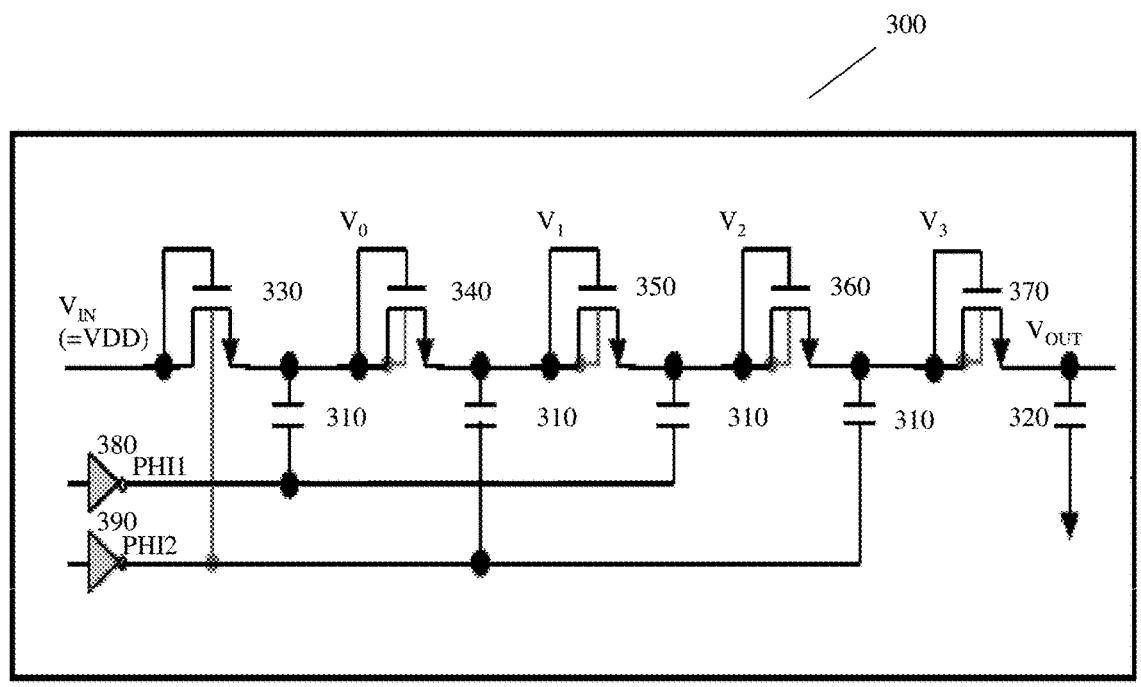
FIGS. 2A-2B show a diode-based charge pump using a fully depleted silicon on insulator (FDSOI) structure in accordance with aspects of the present disclosure.

FIG. 2A shows a diode-based charge pump using the fully depleted silicon on insulator (FDSOI) structure in accordance with aspects of the present disclosure. FIG. 2A includes a diode-based Dickson charge pump 300 with multiple stages. In particular, the diode-based Dickson charge pump 300 includes a first capacitor 310 at multiple stages, a second capacitor 320, transistor diodes 330, 340, 350, 360, and 370, and inverters (or buffer) 380, 390. An input voltage $V_{IN}$ (which is equal to a VDD voltage), a voltage $V_0$, a voltage $V_1$, a voltage $V_2$, a voltage $V_3$, an output voltage $V_{OUT}$, and signals PHI1 and PHI2 are further provided. Each of the transistor diodes 330, 340, 350, 360, and 370 in FIG. 2A are FDSOI devices.

In FIG. 2A, the back-gate of the transistor diode 330 of the first stage is biased with a switching clock voltage (i.e., PHI2). Further, the back-gate of the transistor diodes 340, 350, 360, and 370 of subsequent stages are biased with the same switching voltage generated for the front-gate voltage. Further, the diode-based charge pump 300 uses a fully depleted SOI device (i.e., transistor diodes 330, 340, 350, 360, and 370) that does not have a drain/source-to-well junction diode. In embodiments, although a fully depleted SOI device is described, the present disclosure is applicable to any independent multi-gate device that does not have a drain/source-to-well junction diode.

In FIG. 2A, the configuration of the diode-based charge pump 300 with the fully depleted SOI device reduces the threshold voltage of the diode during the charging and pumping phase and returns to the higher and non-back-gate biased threshold voltage during the holding phase. Further, in embodiments, the threshold voltages of the transistor diodes 330, 340, 350, 360, and 370 at each stage of the diode-based charge pump 300 are almost identical due to an almost identical back-gate bias.

Still referring to FIG. 2A, the topology of the diode-based charge pump 300 does not require an additional high-voltage back-gate biasing generator and switch since the diode-based Dickson charge pump 300 is dynamically self biased. As a result of reduced threshold voltages in each stage, the diode-based Dickson charge pump 300 has higher voltage conversion efficiency and higher maximum output voltage in comparison to known bulk devices.

Figure 2B:
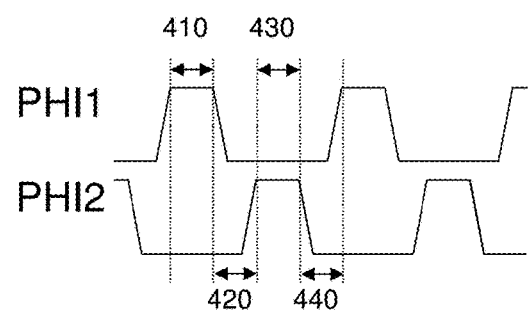

FIG. 2B is a timing cycle for the diode-based charge pump 300 using the FDSOI device of FIG. 2A. As shown in FIG. 2B, the timing cycle includes PHI1 and PHI2 signals. Further, each of the PHI1 signals can have a low voltage level and a high voltage level. A time period of PHI1 going to a high voltage level is in a first phase 410; whereas a time period of PHI2 going to a high voltage level is in a third phase 430. A transitional time period when PH1 going to a low voltage and PH2 going to a high voltage level is in a second phase 420. Lastly, a transitional time period when PHI2 going to a low voltage and PHI1 going to a high voltage level is in a fourth phase 440. The two transitional periods are called the non-overlap time period to ensure PHI1 and PH2 are not at high voltage at the same time, hence, avoiding two diode adjacent transistors turning on at the same time.

Figure 3A:
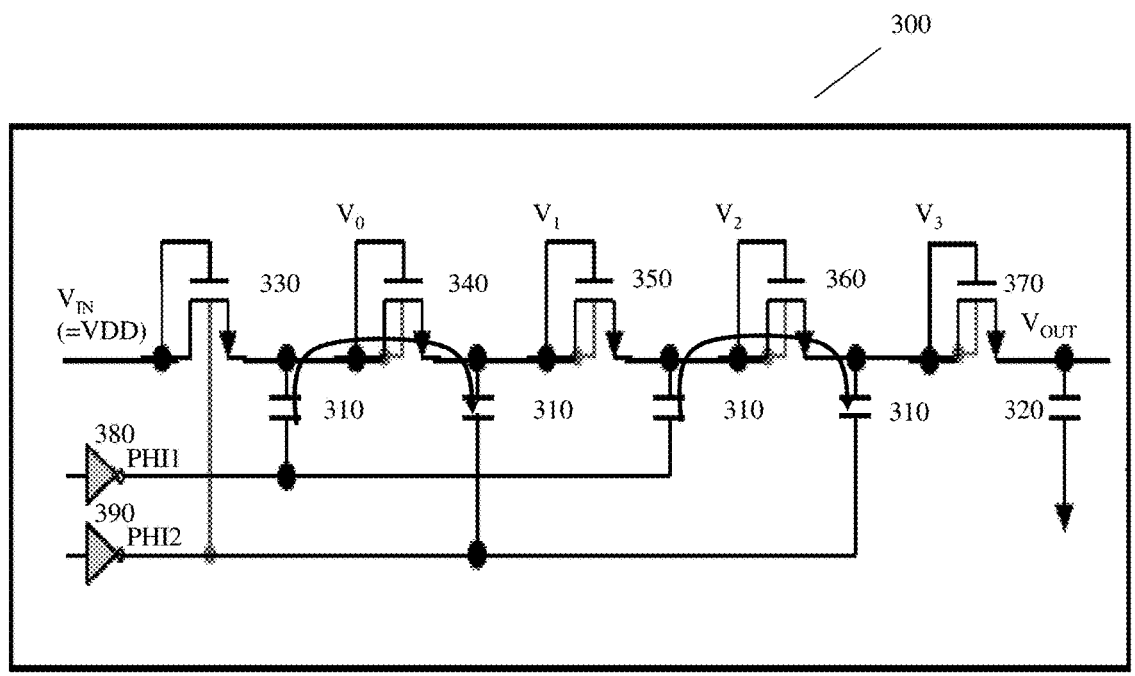
FIGS. 3A-3B show the diode-based charge pump operation in a first phase in accordance with aspects of the present disclosure.

FIG. 3A shows the diode-based charge pump 300 in a first phase 410 in accordance with aspects of the present disclosure. In the first phase 410, PHI1 goes to a high voltage level. As PHI1 goes to a high voltage level, transistor diodes 330, 350, and 370 are turned off. As shown by the current flow arrows, transistor diodes 340 and 360 are turned on when PHI1 goes to a high voltage level. The back-gate voltage of transistor diodes 340 and 360 (i.e., ON diodes) is at least equal to the highest of drain (or source) voltage to minimize ON resistance. Further, the back-gate voltage of transistor diodes 330, 350, and 370 (i.e., OFF diodes) is at most equal to the lowest of drain (or source) voltage to minimize OFF leakage.

Figure 3B:
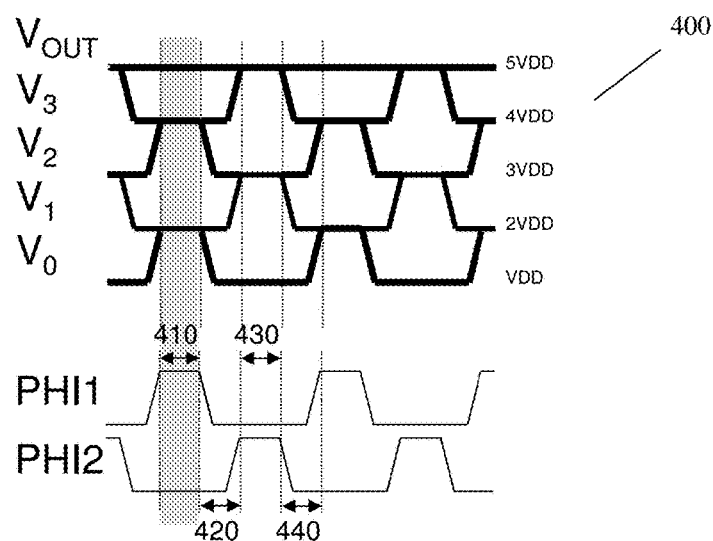

FIG. 3B is a timing cycle for the diode-based charge pump 300 shown in FIG. 3A. As transistor diodes 330, 350, and 370 are turned off, $V_1$ and $V_3$ are at a low voltage level. Further, as transistor diodes 340 and 360 are turned on, $V_0$ and $V_2$ are at a high voltage level. $V_{OUT}$ remains at the high voltage level throughout the first phase 410.

Figure 4A:
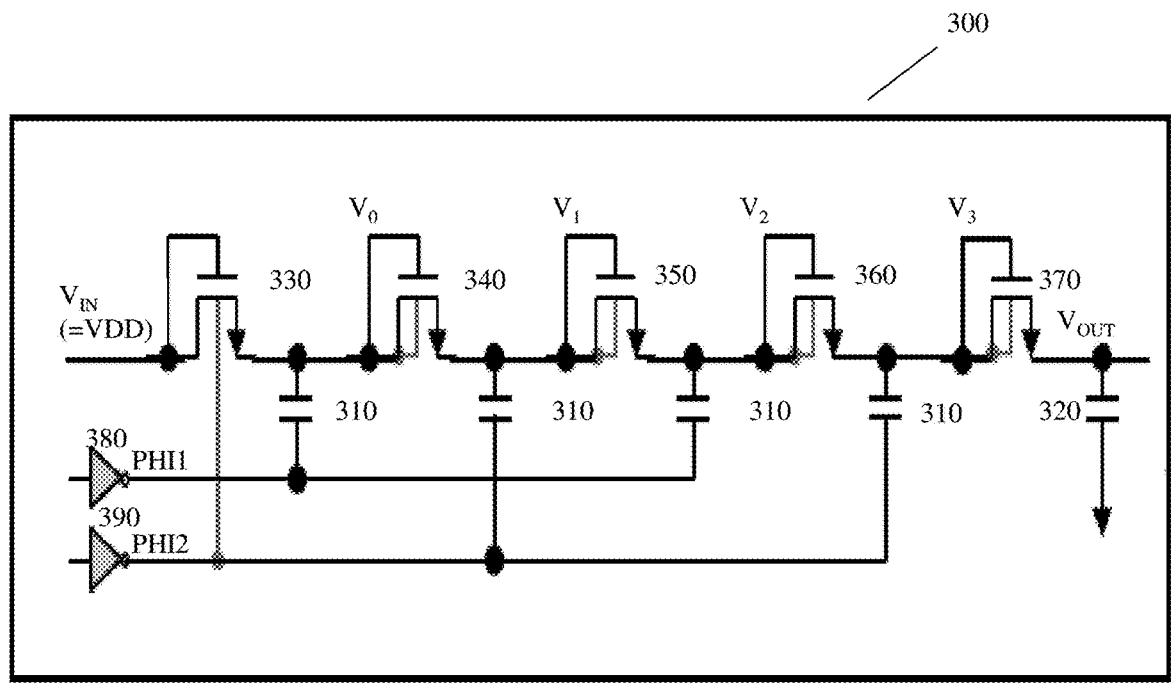
FIGS. 4A-4B show the diode-based charge pump operation in a second phase (which is a transitional phase between $1^{st}$ phase to $3^{rd}$ phase) in accordance with aspects of the present disclosure.

FIG. 4A shows the diode-based charge pump 300 in a second phase 420 in accordance with aspects of the present disclosure. In the second phase 420, PHI1 is transitioning from a high voltage level to a low voltage level. Further, in the second phase 420, PHI2 is transitioning from a low voltage level to a high voltage level. In this situation, as both PHI1 and PHI2 are transitioning between levels, all transistor diodes 330, 340, 350, 360, and 370 are turned off.

Figure 4B:
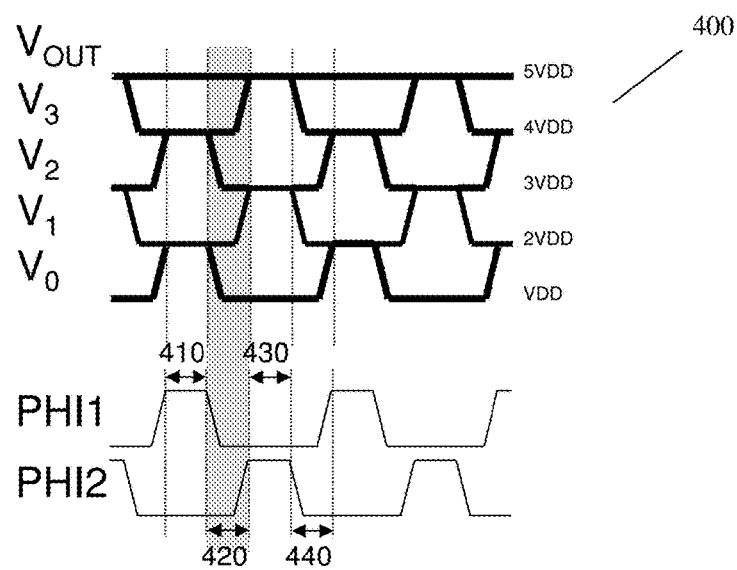

FIG. 4B is a timing cycle for the diode-based charge pump 300 shown in FIG. 4A. At the beginning of the second phase 420, $V_1$ and $V_3$ are at a low voltage level. Then, $V_1$ and $V_3$ start to transition from the low voltage level to the high voltage level and reach the high voltage level at the end of the second phase 420. Further, at the beginning of the second phase 420, $V_0$ and $V_2$ are at a high voltage level. Then, $V_0$ and $V_2$ start to transition from the high voltage level to the low voltage level and reach the low voltage level at the end of the second phase 420. $V_{OUT}$ remains at the high voltage level throughout the second phase 420.

Figure 5A:
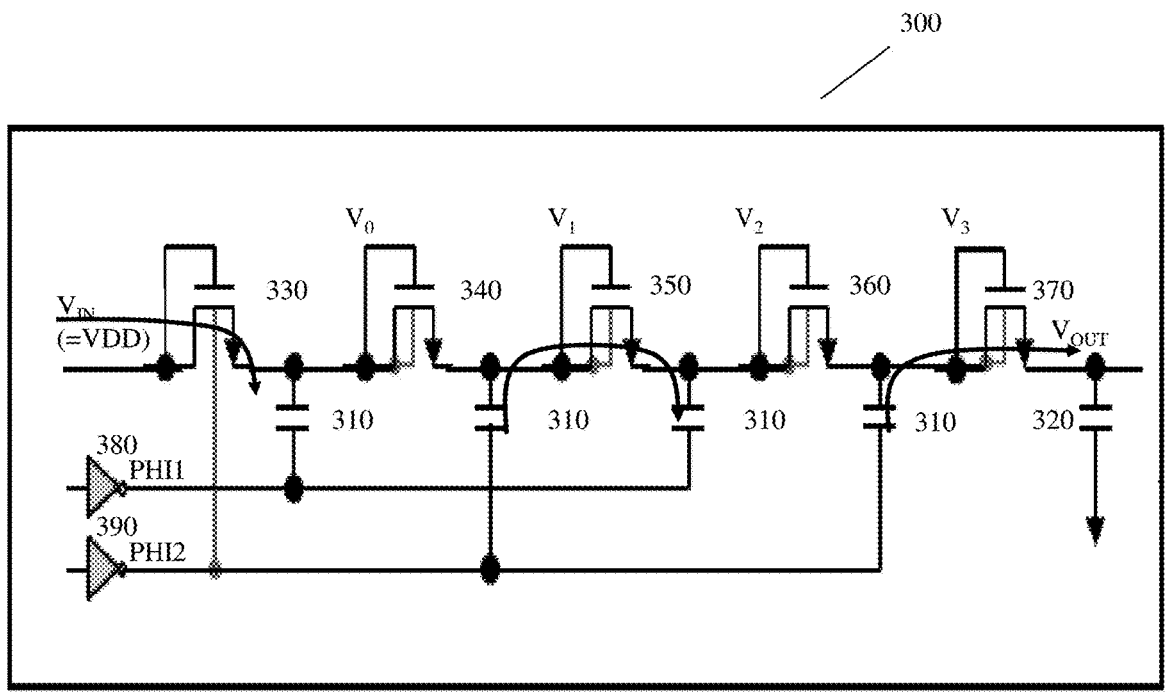
FIGS. 5A-5B show the diode-based charge pump operation in a third phase in accordance with aspects of the present disclosure.

FIG. 5A shows the diode-based charge pump 300 in a third phase 430 in accordance with aspects of the present disclosure. In the third phase 430, PHI2 goes to a high voltage level. As PHI2 goes to a high voltage level, transistor diodes 340 and 360 are turned off. As shown by the current flow arrows, transistor diodes 330, 350, and 370 are turned on when PHI2 goes to a high voltage level.

Figure 5B:
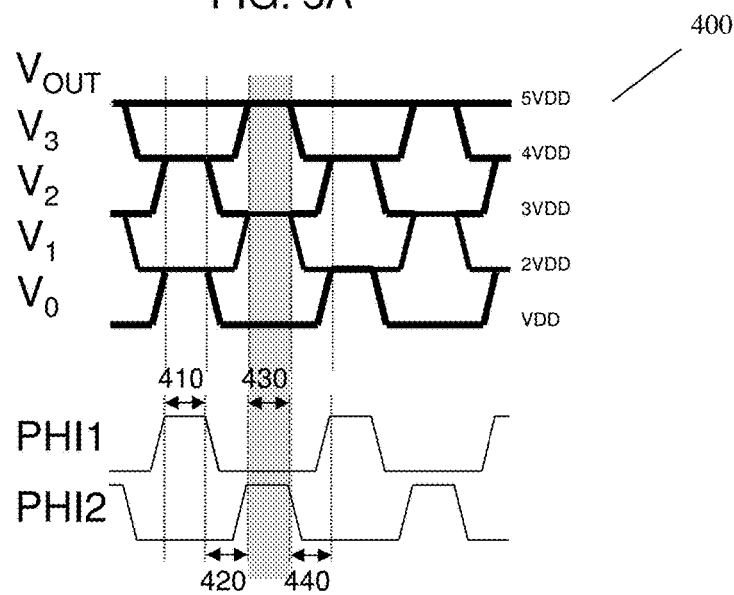

FIG. 5B is a timing cycle for the diode-based charge pump 300 shown in FIG. 5A. As transistor diodes 340 and 360 are turned off, $V_0$ and $V_2$ are at a low voltage level. Further, as transistor diodes 330, 350, and 370 are turned on, $V_1$ and $V_3$ are at a high voltage level. $V_{OUT}$ remains at the high voltage level throughout the third phase 430.

Figure 6A:
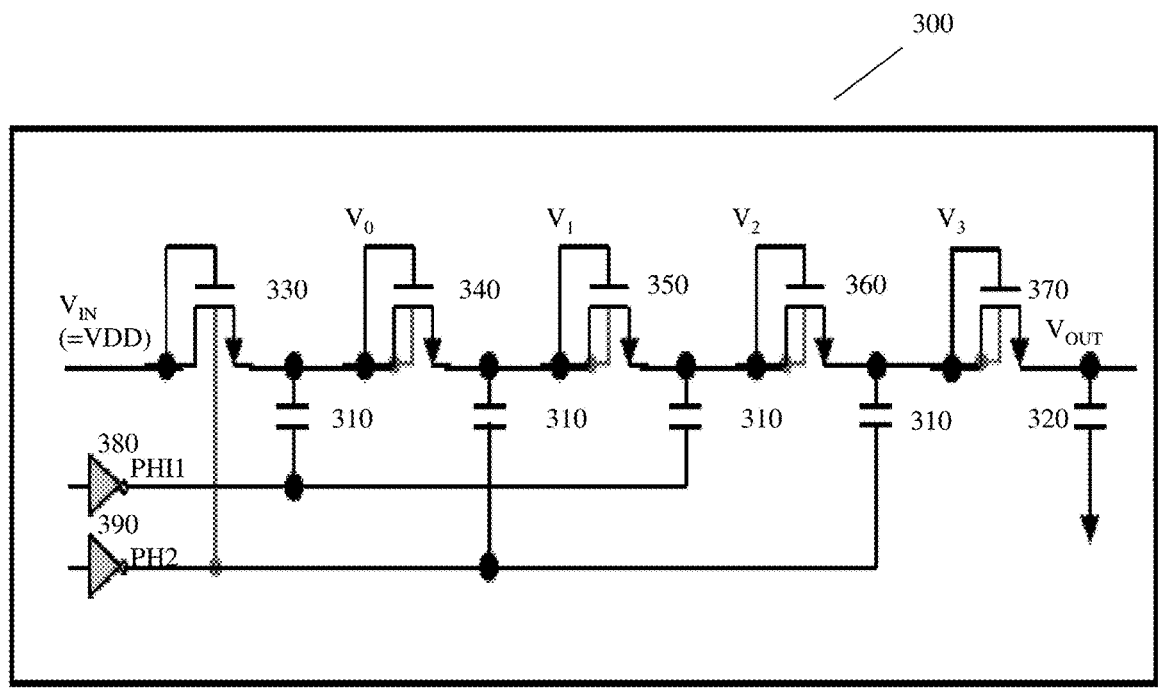
FIGS. 6A-6B show the diode-based charge pump operation in a fourth phase (which is a transitional phase between $3^{rd}$ phase to $1^{st}$ phase of the next clock cycle) in accordance with aspects of the present disclosure.

FIG. 6A shows the diode-based charge pump 300 in a fourth phase 440 in accordance with aspects of the present disclosure. In the fourth phase 440, PHI1 transitions from a low voltage level to a high voltage level. Further, in the fourth phase 440, PHI2 is transitioning from a high voltage level to a low voltage level. In this situation, as both PHI1 and PHI2 are transitioning between levels, all transistor diodes 330, 340, 350, 360, and 370 are turned off.

Figure 6B:
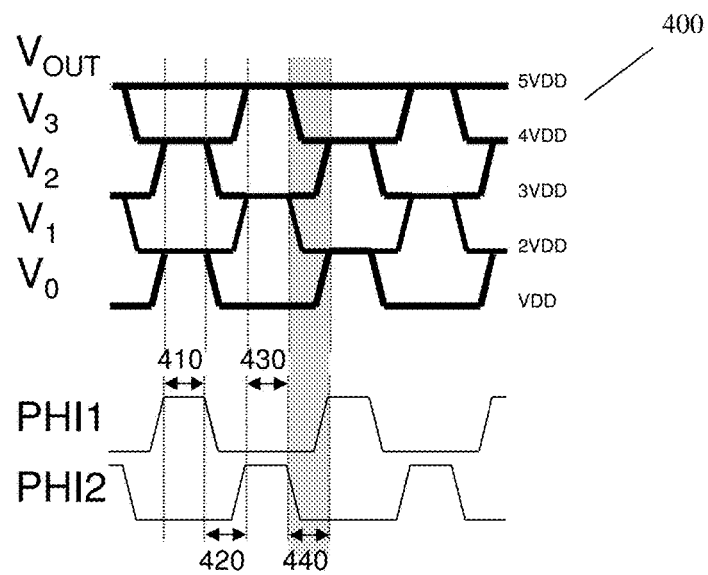

FIG. 6B is a timing cycle for the diode-based charge pump 300 shown in FIG. 6A. At the beginning of the fourth phase 440, $V_0$ and $V_2$ are at a low voltage level. Then, $V_0$ and $V_2$ start to transition from the low voltage level to the high voltage level and reach the high voltage level at the end of the fourth phase 440. Further, at the beginning of the fourth phase 440, $V_1$ and $V_3$ are at a high voltage level. Then, $V_1$ and $V_3$ start to transition from the high voltage level to the low voltage level and reach the low voltage level at the end of the fourth phase 440. $V_{OUT}$ remains at the high voltage level throughout the second phase 440.

Figures 7A, 7B:
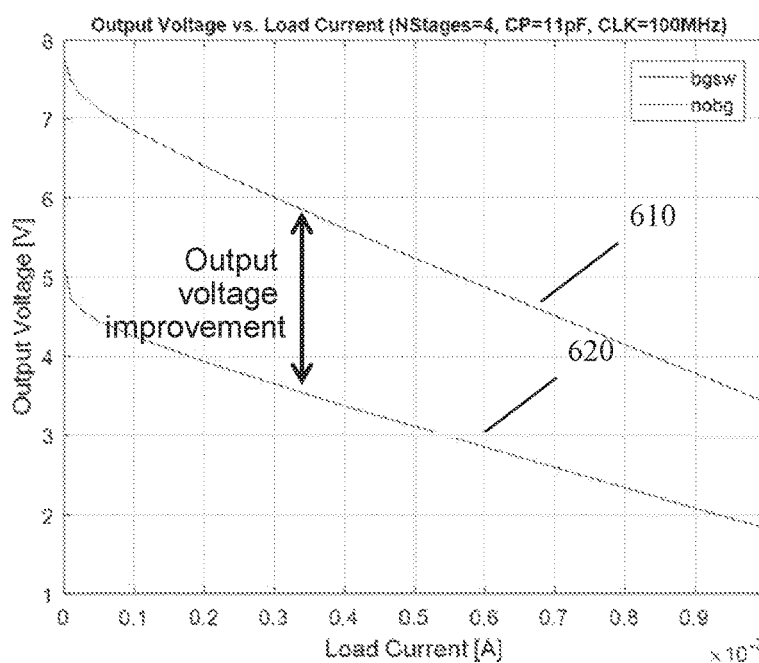
FIG. 7A shows a performance of the diode-based charge pump in accordance with aspects of the present disclosure.
FIG. 7B shows a performance graph of the diode-based charge pump in accordance with aspects of the present disclosure.

FIG. 7A shows the performance of the diode-based charge pump 300 in accordance with aspects of the present disclosure. In FIG. 7A, a table 500 shows the performance of the diode-based charge pump 300 versus conventional circuits. In particular, the table 500 shows the output voltage, VOUT vs. load current, ILOAD, using the diode-based charge pump 300 with four stages using 11 picofarads (i.e., pf) charge-pump capacitor per stage and clocked at 100 MHz. In the table 500, the first column shows the load current, ILOAD, the second column shows the diode-based Dickson charge pump 300 for self-biased back-gate switching bias (i.e., bgsw), and the third column shows the results for a conventional circuit using a bulk substrate with no back-gate biasing, nobg.

As shown in FIG. 7A, at a no load current condition, the maximum achievable output voltage using the diode-based charge pump 300 in self-biased back-gate switching bias (i.e., bgsw) is 7.77 volts with a voltage conversion efficiency of 86.3%. In contrast, the maximum achievable output voltage using the conventional circuit using a bulk substrate with no back-gate biasing (i.e., nobg) is 5.17 volts with a voltage conversion efficiency of 62.0%. Therefore, one of ordinary skill in the art would understand that the diode-based charge pump 300 using self-biased back-gate switching bias leads to a higher maximum output voltage and increased voltage conversion efficiency.

FIG. 7B shows a graph 600 describing the result of the table 500 in FIG. 7A. In FIG. 7B, the y-axis of the graph 600 shows the output voltage in volts and the x-axis of the graph 600 shows the load current in $10^{-3}$ amperes. The upper line 610 is the diode-based Dickson charge pump 300 using self-biased back-gate switching bias (i.e., bgsw) and the lower line 620 is a conventional circuit using a bulk substrate with no back-gate biasing (i.e., nobg). Thus, one of ordinary skill in the art would understand that at each load current, the diode-based charge pump 300 using self-biased back-gate switching bias (i.e., bgsw) has an improved maximum output voltage and higher voltage conversion efficiency.

The circuit and method for reducing diode threshold voltage and on state resistance of switched-capacitor charge pumps of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for reducing diode threshold voltage and on state resistance of switched-capacitor charge pumps of the present disclosure has been adopted from integrated circuit (IC) technology. For example, the structures are built on wafers and are realized in films of material patterned by photolithographic processes on the top of a wafer. In particular, the fabrication of the circuit and a method for reducing diode threshold voltage and on state resistance of switched-capacitor charge pumps uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a diode-based Dickson charge pump which is configured to use an independent multi-gate device to reduce a threshold voltage of a plurality of transistor diodes during a charging and pumping phase, wherein a back-gate of a transistor diode of a first stage of the charge pump is biased with a switching clock voltage, a back-gate of each subsequent transistor diode in subsequent stages of the charge pump is biased with a switching voltage generated for a front gate voltage of each subsequent transistor, and each subsequent transistor diode is a fully depleted silicon on insulator (FDSOI) NFET device.

2. The structure of claim 1, wherein the independent multi-gate device is the fully depleted silicon on insulator (FDSOI) device.

3. The structure of claim 2, wherein the FDSOI device comprises a source and a drain which are isolated from a well of a substrate by an insulating layer.

4. The structure of claim 1, wherein the diode-based Dickson charge-pump comprises a plurality of cascaded Villard doublers and a peak detector.

5. The structure of claim 4, wherein the plurality of cascaded Villard doublers is followed by the peak detector.

6. The structure of claim 1, wherein the charge pump is configured to use the independent multi-gate device to return the threshold voltage of the plurality of transistor diodes to a higher voltage during a holding phase.

7. The structure of claim 1, further comprising a plurality of capacitors connected between each stage of the charge pump.

8. A structure comprising a diode-based Dickson charge pump which is configured to use a fully-depleted silicon on insulator (FDSOI) structure to reduce a threshold voltage of a plurality of transistor diodes during a charging and pumping phase,
wherein a back-gate of a transistor diode of a first stage of the charge pump is biased with a switching clock voltage,
a back-gate of each subsequent transistor diode in subsequent stages of the charge pump is biased with a switching voltage generated for a front gate voltage of each subsequent transistor, and
each subsequent transistor diode is a FDSOI NFET device.

9. The structure of claim 8, wherein the FDSOI structure comprises a source and a drain which are isolated from a well of a substrate by an insulating layer.

10. The structure of claim 8, wherein the diode-based Dickson charge-pump comprises a plurality of cascaded Villard doublers followed by a peak detector.

11. The structure of claim 8, wherein the diode-based Dickson charge pump is configured to use the FDSOI structure to return the threshold voltage of the plurality of transistor diodes to a higher voltage during a holding phase.

12. The structure of claim 8, further comprising a plurality of capacitors connected between each stage of the charge pump.

13. A method comprising:
reducing a threshold voltage of a plurality of transistor diodes in a charge pump from a predetermined voltage level during a charging and pumping phase;
returning the threshold voltage of the plurality of transistor diodes to the predetermined voltage level in the charge pump during a holding phase;
biasing a back-gate of a transistor diode of a first stage of the charge pump with a switching clock voltage; and
biasing a back-gate of each subsequent transistor diode in subsequent stages of the charge pump with a switching voltage generated for a front gate voltage of each subsequent transistor,
wherein each subsequent transistor diode is a fully depleted silicon on insulator (FDSOI) NFET device.

14. The method of claim 13, wherein the charge pump is a diode-based Dickson charge-pump which uses an independent multi-gate device to reduce the threshold voltage.

15. The method of claim 14, wherein the independent multi-gate device is the fully depleted silicon on insulator (FDSOI) device.

16. The method of claim 15, wherein the FDSOI device comprises a source and a drain which are isolated from a well of a substrate by an insulating layer.

17. The structure of claim 1, further comprising a first inverter which is connected to the switching clock voltage.

18. The structure of claim 17, further comprising a second inverter which is connected to another switching clock voltage, and the another switching clock voltage is connected to a first node between the first stage and a second stage of the charge pump and a third node between a third stage and a fourth stage of the charge pump.

19. The structure of claim 18, wherein the switching clock voltage is also connected to a second node between the second stage and the third stage of the charge pump and a fourth node between the fourth stage and a fifth stage of the charge pump.

* * * * *